United States Patent
Wang et al.

(10) Patent No.: US 11,463,642 B2
(45) Date of Patent: Oct. 4, 2022

(54) IMAGE SENSOR INCLUDING PIXEL ARRAY AND MOBILE TERMINAL

(71) Applicant: VIVO MOBILE COMMUNICATION CO., LTD., Chang'an Dongguan (CN)

(72) Inventors: Danmei Wang, Chang'an Dongguan (CN); Huazhao Zhou, Chang'an Dongguan (CN); Panpan Zhu, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 0 days.

(21) Appl. No.: 17/152,368

(22) Filed: Jan. 19, 2021

(65) Prior Publication Data

US 2021/0144323 A1    May 13, 2021

Related U.S. Application Data

(63) Continuation of application No. PCT/CN2019/095366, filed on Jul. 10, 2019.

(30) Foreign Application Priority Data

Jul. 19, 2018    (CN) .......................... 201810796852.4

(51) Int. Cl.
*H04N 5/369* (2011.01)
*H04N 9/04* (2006.01)
(Continued)

(52) U.S. Cl.
CPC ..... *H04N 5/36965* (2018.08); *H04N 5/36961* (2018.08); *H04N 5/379* (2018.08); (Continued)

(58) Field of Classification Search
CPC ........... H04N 5/36965; H04N 5/36961; H04N 5/379; H04N 5/372; H04N 5/374; H04N 9/04553; H04N 9/04559
See application file for complete search history.

(56) References Cited

U.S. PATENT DOCUMENTS

2003/0183746 A1    10/2003    Chen
2011/0080506 A1    4/2011    Weng
(Continued)

FOREIGN PATENT DOCUMENTS

CN    104065894 A    9/2014
CN    105957492 A    9/2016
(Continued)

OTHER PUBLICATIONS

European Search Report related to PCT/CN2019/095366 reported on Jul. 12, 2021.
(Continued)

*Primary Examiner* — Antoinette T Spinks
(74) *Attorney, Agent, or Firm* — von Briesen & Roper, s.c.

(57) ABSTRACT

An image sensor and a mobile terminal are provided. The image sensor includes a pixel array, where the pixel array includes a preset quantity of pixel units arranged in a predetermined manner. The pixel unit includes a first pixel and a second pixel. The first pixel includes a red sub-pixel, a green sub-pixel, and a blue sub-pixel, and the second pixel includes a green sub-pixel, a preset sub-pixel, and at least one of a red sub-pixel and a blue sub-pixel. Both the first pixel and the second pixel are full-pixel dual-core focusing pixels, and each of the first pixel and the second pixel includes four full-pixel dual-core focusing sub-pixels. The preset sub-pixel receives an infrared band and one of a red band, a green band, and a blue band, or the preset sub-pixel (Continued)

receives an infrared band, a red band, a green band, and a blue band.

18 Claims, 8 Drawing Sheets

(51) Int. Cl.
*H04N 5/372* (2011.01)
*H04N 5/374* (2011.01)

(52) U.S. Cl.
CPC ..... *H04N 9/04553* (2018.08); *H04N 9/04559* (2018.08); *H04N 5/372* (2013.01); *H04N 5/374* (2013.01)

(56) References Cited

U.S. PATENT DOCUMENTS

| | | |
|---|---|---|
| 2011/0310276 A1 | 12/2011 | Lim |
| 2013/0140663 A1 | 6/2013 | Fukuda |
| 2014/0285627 A1 | 9/2014 | Kuboi |
| 2014/0362368 A1 | 12/2014 | Kikuchi |
| 2016/0037107 A1 | 2/2016 | Sakaguchi |
| 2016/0255267 A1* | 9/2016 | Takamiya ............... G02B 7/34 348/349 |
| 2017/0330520 A1 | 11/2017 | Tien et al. |
| 2018/0011008 A1 | 1/2018 | Ogawa et al. |
| 2018/0020179 A1 | 1/2018 | Wan |
| 2018/0063456 A1 | 3/2018 | Lee |
| 2018/0131882 A1 | 5/2018 | Nam et al. |
| 2018/0316845 A1* | 11/2018 | Ouyang ............... G02B 7/346 |
| 2019/0268543 A1 | 8/2019 | Kato |
| 2021/0144323 A1 | 5/2021 | Wang et al. |

FOREIGN PATENT DOCUMENTS

| | | |
|---|---|---|
| CN | 106982328 A | 7/2017 |
| CN | 107040724 A | 8/2017 |
| CN | 107610319 A | 1/2018 |
| CN | 207354459 U | 5/2018 |
| CN | 108271012 A * | 7/2018 |
| CN | 108271012 A | 7/2018 |
| CN | 108511480 A | 9/2018 |
| CN | 108600712 A | 9/2018 |
| CN | 108965665 A | 12/2018 |
| JP | 2012059845 A | 3/2012 |
| JP | 2014183206 A | 9/2014 |
| JP | 2014239290 A | 12/2014 |
| JP | 2016033980 A | 3/2016 |
| JP | 2016157093 A | 9/2016 |
| JP | 2017118283 A | 6/2017 |
| JP | 2018056519 A | 4/2018 |
| JP | 2018093284 A | 6/2018 |
| WO | 2012032911 A1 | 3/2012 |

OTHER PUBLICATIONS

International Search Report & Written Opinion related to Application No. PCT/CN2019/095366; reported on Jan. 28, 2021.
Chinese Office Action for related Application No. 201810796852.4; reported on Oct. 9, 2019.
Japanese Office Action related to Application No. 2021502977 dated Apr. 25, 2022.

* cited by examiner

| R | R | G | G | D | D | G | G |
|---|---|---|---|---|---|---|---|
| G | G | B | B | G | G | B | B |
| R | R | G | G | R | R | G | G |
| G | G | B | B | G | G | B | B |

FIG. 2b

| R | R | G | G | R | R | G | G |
|---|---|---|---|---|---|---|---|
| G | G | B | B | G | G | D | D |
| R | R | G | G | R | R | G | G |
| G | G | B | B | G | G | B | B |

FIG. 2c

| R | R | G | G | R | D | D | G |
|---|---|---|---|---|---|---|---|
| G | G | B | B | G | G | B | B |
| R | R | G | G | R | R | G | G |
| G | G | B | B | G | G | B | B |

FIG. 3a

| R | R | G | G | R | R | G | G |
|---|---|---|---|---|---|---|---|
| G | G | B | B | G | D | D | B |
| R | R | G | G | R | R | G | G |
| G | G | B | B | G | G | B | B |

FIG. 3b

| R | R | G | G | R | R | G | G |
|---|---|---|---|---|---|---|---|
| G | G | B | D | D | G | B | B |
| R | R | G | G | R | R | G | G |
| G | G | B | B | G | G | B | B |

FIG. 4a

| R | R | G | G | R | R | G | G |
|---|---|---|---|---|---|---|---|
| G | G | B | B | G | G | B | B |
| R | R | G | D | D | R | G | G |
| G | G | B | B | G | G | B | B |

FIG. 4b

| R | R | G | G | R | R | G | G |
|---|---|---|---|---|---|---|---|
| G | G | B | B | G | G | D | D |

FIG. 5a

| R | R | G | G | D | D | G | G | R | R | G | G |
|---|---|---|---|---|---|---|---|---|---|---|---|
| G | G | B | B | G | G | B | B | G | G | B | B |

| R | R | G | G | R | R | G | G |
|---|---|---|---|---|---|---|---|
| G | G | B | D | D | G | B | B |

| R | R | G | D | D | R | G | G | R | R | G | G |
|---|---|---|---|---|---|---|---|---|---|---|---|
| G | G | B | B | G | G | B | B | G | G | B | B |

IMAGE SENSOR INCLUDING PIXEL ARRAY AND MOBILE TERMINAL

CROSS-REFERENCE TO RELATED APPLICATIONS

This application is continuation application of PCT International Application No. PCT/CN2019/095366 filed on Jul. 10, 2019, which claims priority to Chinese Patent Application No. 201810796852.4 in China on Jul. 19, 2018, the disclosures of which are incorporated in their entireties by reference herein.

TECHNICAL FIELD

This disclosure relates to the field of image processing technologies, and in particular, to an image sensor and a mobile terminal.

BACKGROUND

In the related art, intelligent electronic products have gradually become necessities in people's life. As an important configuration of an electronic product, a photographing function is also gradually developing. However, as the photographing function is promoted and gains popularity, people are no longer satisfied with a camera having only a photographing function in current intelligent electronic products, but more expect diverse photographing effects, diverse playing methods, and diverse functions.

In the market, for a pixel array arrangement of a complementary metal oxide semiconductor (CMOS) image sensor, a red (R)-green (G)-blue (B) Bayer pixel array arrangement mode is most commonly used, as shown in FIG. 1a and FIG. 1b. However, an object distance cannot be detected in this arrangement mode, and only natural light can be received for photographing under normal lighting to record images.

A pixel array arrangement mode of a 2PD full-pixel dual-core technology is shown in FIG. 1c and FIG. 1d. In this arrangement mode, also only natural light can be received for photographing to record images. However, compared with the phase detection auto focus (PDAF) technical solution, this can support additional object distance detection to perform a focusing action more quickly.

A principle of the 2PD phase detection technology is described as follows: As can be seen from FIG. 1c and FIG. 1d, some R, G, and B sub-pixels in the pixel array each are divided into two parts. Different light energy is obtained in different incidence directions, so that a left sub-pixel and a right sub-pixel form a phase detection pair. When a luminance value of the left sub-pixel and a luminance value of the right sub-pixel both reach relative maximum peaks, an image is comparatively clearest, which is a sharp focus. Then the object distance is obtained through calculation by using an algorithm to implement fast focus.

To sum up, in the pixel array arrangement of the image sensor based on the CMOS, an object distance cannot be detected, and only natural light can be received; and in the pixel array arrangement of the 2PD technology, although an object distance can be detected, only natural light can be received. Therefore, in the pixel array arrangement modes of the image sensor in the related art, photographing scenes are limited, and focusing is slow, thereby affecting photographing experience of a user.

SUMMARY

Embodiments of this disclosure provide an image sensor and a mobile terminal.

According to a first aspect, an embodiment of this disclosure provides an image sensor, including:

a pixel array, where the pixel array includes a preset quantity of pixel units arranged in a predetermined manner, and the pixel unit includes a first pixel and a second pixel adjacent to the first pixel; the first pixel includes a red sub-pixel, a green sub-pixel, and a blue sub-pixel, and the second pixel includes a green sub-pixel, a preset sub-pixel, and at least one of a red sub-pixel and a blue sub-pixel;

both the first pixel and the second pixel are full-pixel dual-core focusing pixels, and each of the first pixel and the second pixel includes four full-pixel dual-core focusing sub-pixels; and the preset sub-pixel receives an infrared band and one of a red band, a green band, and a blue band, or the preset sub-pixel receives an infrared band, a red band, a green band, and a blue band.

According to a second aspect, an embodiment of this disclosure further provides a mobile terminal, including an imaging system, where the imaging system includes:

the image sensor described above;

a lens module;

a drive module configured to drive movement of the lens module;

a filter module disposed between the lens module and the image sensor;

an image data processing module connected to the image sensor; and a display module connected to the image data processing module.

In the technical solution of this disclosure, an RGB pixel array arrangement of a 2PD image sensor is improved by optimizing the RGB pixel array arrangement to a pixel array arrangement in which RGB pixels and a preset pixel are combined. In this way, distance detection can be implemented in a 2PD manner to ensure fast focus. The preset pixels used for receiving different light bands are set to increase an amount of incident light, thereby improving the photoelectric conversion efficiency, ensuring a dark-state photographing effect, and meeting use requirements of users.

BRIEF DESCRIPTION OF DRAWINGS

The following clearly describes the technical solutions in the embodiments of this disclosure with reference to the accompanying drawings in the embodiments of this disclosure. Apparently, the described embodiments are some but not all of the embodiments of this disclosure. All other embodiments obtained by a person of ordinary skill in the art based on the embodiments of this disclosure without creative efforts shall fall within the protection scope of this disclosure.

FIG. 2b is a schematic diagram 2 of a pixel unit according to an embodiment of this disclosure;

FIG. 2c is a schematic diagram 3 of a pixel unit according to an embodiment of this disclosure;

FIG. 3a is a schematic diagram 4 of a pixel unit according to an embodiment of this disclosure;

FIG. 3b is a schematic diagram 5 of a pixel unit according to an embodiment of this disclosure;

FIG. 4a is a schematic diagram 6 of a pixel unit according to an embodiment of this disclosure;

FIG. 4b is a schematic diagram 7 of a pixel unit according to an embodiment of this disclosure;

FIG. 5a is a schematic diagram 8 of a pixel unit according to an embodiment of this disclosure;

DESCRIPTION OF EMBODIMENTS

Figures 1A, 1B:
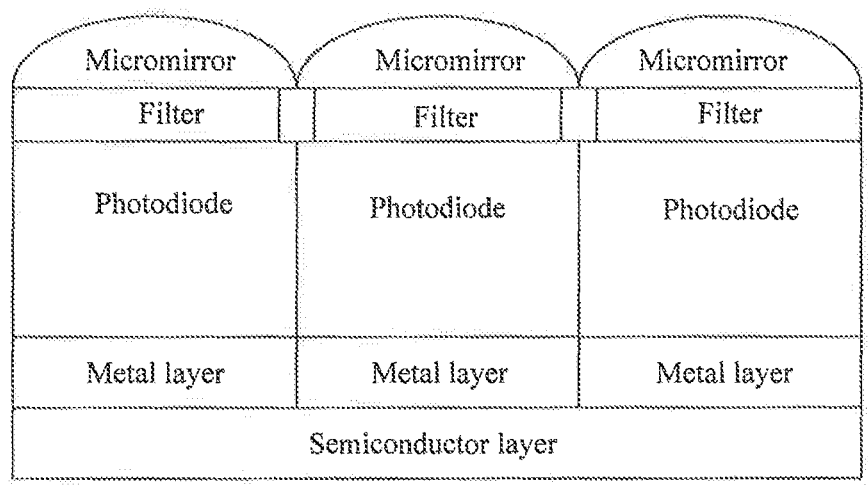
FIG. 1a is a schematic diagram of an RGB arrangement in the related art.
FIG. 1b is a cross-sectional view of a pixel.
Figures 1C, 1D, 2A:
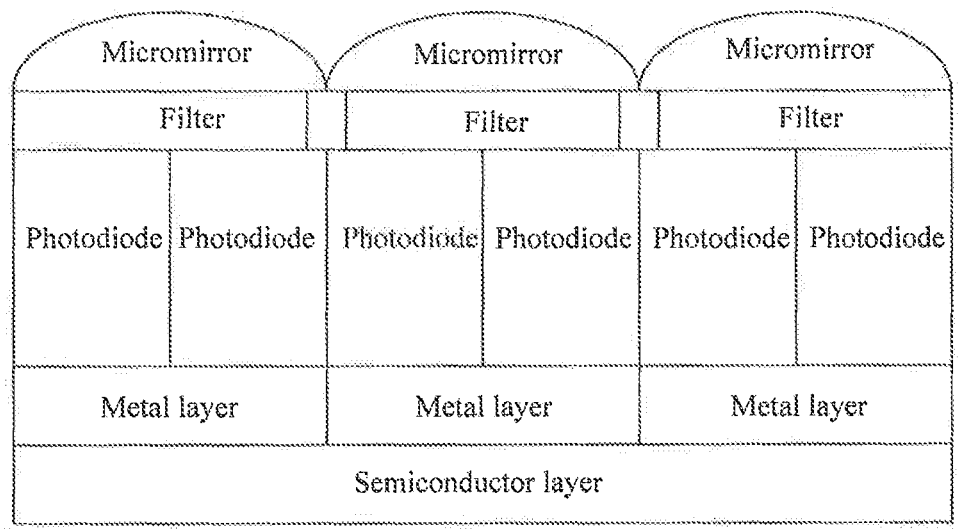
FIG. 1c is a diagram of a 2PD pixel array arrangement.
FIG. 1d is a cross-sectional view of a 2PD pixel.
FIG. 2a is a schematic diagram 1 of a pixel unit according to an embodiment of this disclosure.

The following clearly describes the technical solutions in the embodiments of this disclosure with reference to the accompanying drawings in the embodiments of this disclosure. Apparently, the described embodiments are some but not all of the embodiments of this disclosure. All other embodiments obtained by a person of ordinary skill in the art based on the embodiments of this disclosure without creative efforts shall fall within the protection scope of this disclosure.

An embodiment of this disclosure provides an image sensor, including a pixel array. The pix array includes a preset quantity of pixel units arranged in a predetermined manner, as shown in FIG. 2a to FIG. 2c, FIG. 3a to FIG. 3b, and FIG. 4a to FIG. 4b. The pixel unit includes a first pixel and a second pixel adjacent to the first pixel. The first pixel includes a red sub-pixel, a green sub-pixel, and a blue sub-pixel, and the second pixel includes a green sub-pixel, a preset sub-pixel, and at least one of a red sub-pixel and a blue sub-pixel.

Both the first pixel and the second pixel are full-pixel dual-core focusing pixels, and each of the first pixel and the second pixel includes four full-pixel dual-core focusing sub-pixels. The preset sub-pixel receives an infrared band and one of a red band, a green band, and a blue band, or the preset sub-pixel receives an infrared band, a red band, a green band, and a blue band.

The pixel array included in the image sensor provided in this embodiment of this disclosure includes the preset quantity of pixel units, where the pixel units of the preset quantity are arranged in the predetermined manner. The pixel units of the preset quantity each include the first pixel and the second pixel. The first pixel is different from the second pixel. The first pixel includes a red sub-pixel (R), a green sub-pixel (G), and a blue sub-pixel (B), and the second pixel includes at least one of a red sub-pixel and a blue sub-pixel, and also includes a green sub-pixel and a preset sub-pixel (D).

The first pixel and the second pixel in this embodiment of this disclosure are full-pixel dual-core focusing (2PD) pixels. An object distance can be detected by using the 2PD pixels, to more quickly complete a focusing action. The first pixel and the second pixel herein are both 2PD pixels, that is, the sub-pixels in the first pixel and the second pixel are all 2PD sub-pixels. In addition, each of the first pixel and the second pixel in this embodiment of this disclosure includes four full-pixel dual-core focusing sub-pixels.

The red sub-pixel, the green sub-pixel, and the blue sub-pixel in the first pixel are arranged in a specified manner, and the first pixel includes one red sub-pixel, one blue sub-pixel, and two green sub-pixels. For ease of distinguishing, the two green sub-pixels are called a first green sub-pixel and a second green sub-pixel, and the first green sub-pixel is the same as the second green sub-pixel. The red sub-pixel is adjacent to the first green sub-pixel, the second green sub-pixel is located below the red sub-pixel, the blue sub-pixel is located below the first green sub-pixel, and the second green sub-pixel is adjacent to the blue sub-pixel.

The second pixel is obtained by substituting a sub-pixel on the basis of the first pixel. The second pixel includes at least one of a red sub-pixel or a blue sub-pixel, and also includes a green sub-pixel and a preset sub-pixel. That is, the second pixel may include a red sub-pixel, a green sub-pixel, and a preset sub-pixel, in which case, the preset sub-pixel may substitute the blue sub-pixel in the first pixel. The second pixel may include a green sub-pixel, a blue sub-pixel, and a preset sub-pixel, in which case, the preset sub-pixel may substitute the red sub-pixel in the first pixel. Alternatively, the second pixel may include a green sub-pixel, a red sub-pixel, a blue sub-pixel, and a preset sub-pixel.

A position of the preset sub-pixel in the second pixel may be the same as a position of a sub-pixel in the first pixel, or may be the same as positions of two adjacent different half sub-pixels in the first pixel. Certainly, a position of a half preset sub-pixel in the second pixel may be the same as a position of any one half sub-pixel in the first pixel. In this case, half preset sub-pixels of two adjacent second pixels form the preset sub-pixel. For example, a position of one half preset sub-pixel in the second pixel is the same as a position of a half red sub-pixel in the first pixel, and a position of the other half preset sub-pixel in the second pixel is the same as a position of a half green sub-pixel in the first pixel, so that a complete preset sub-pixel may be formed by combining two second pixels.

The preset sub-pixel in this embodiment of this disclosure may receive an infrared band and any one of a red band, a green band, and a blue band, that is, in addition to the infrared band, the preset sub-pixel may receive the red band; or in addition to the infrared band, the preset sub-pixel receives the green band; or in addition to the infrared band, the preset sub-pixel receives the blue band. Alternatively, the preset sub-pixel receives the infrared band, the red band, the green band, and the blue band. That is, in addition to the infrared band, the preset sub-pixel receives the red band, the green band, and the blue band. A specific manner of receiving a band by the preset sub-pixel may be set according to actual requirements.

In this embodiment of this disclosure, distance detection can be implemented in a 2PD manner to ensure fast focus. The preset pixels used for receiving different light bands are set to increase an amount of incident light, thereby improving the photoelectric conversion efficiency, ensuring a dark-state photographing effect, and meeting use requirements of users.

In this embodiment of this disclosure, as shown in FIG. 2a to FIG. 2c and FIG. 3a to FIG. 3b, the position of the preset sub-pixel in the second pixel is the same as the position of the red sub-pixel, the green sub-pixel, or the blue sub-pixel in the first pixel.

Alternatively, the position of the preset sub-pixel in the second pixel is the same as a position of a first combined sub-pixel in the first pixel or the same as a position of a second combined sub-pixel in the first pixel.

The first combined sub-pixel is a combination of half the red sub-pixel and half the green sub-pixel that are adjacent; and the second combined sub-pixel is a combination of half the green sub-pixel and half the blue sub-pixel that are adjacent.

When the position of the preset sub-pixel in the second pixel is the same as the position of the red sub-pixel in the first pixel, the second pixel includes one blue sub-pixel, two green sub-pixels, and one preset sub-pixel; in this case, the red sub-pixel is replaced with the preset sub-pixel on the basis of the first pixel.

When the position of the preset sub-pixel in the second pixel is the same as the position of the blue sub-pixel in the first pixel, the second pixel includes one red sub-pixel, two green sub-pixels, and one preset sub-pixel; in this case, the blue sub-pixel is replaced with the preset sub-pixel on the basis of the first pixel.

When the position of the preset sub-pixel in the second pixel is the same as the position of the green sub-pixel in the first pixel, the second pixel includes one red sub-pixel, one green sub-pixel, one blue sub-pixel, and one preset sub-pixel; in this case, the green sub-pixel is replaced with the preset sub-pixel on the basis of the first pixel.

When the position of the preset sub-pixel in the second pixel is the same as the position of the first combined sub-pixel in the first pixel, the second pixel includes the red sub-pixel, the green sub-pixel, the blue sub-pixel, and the preset sub-pixel. In this case, the half red sub-pixel and the half green sub-pixel that are adjacent in the 2PD sub-pixels on the basis of the first pixel may be used as the preset sub-pixel, that is, the position of the preset sub-pixel in the second pixel is the same as the positions of the half green sub-pixel and the half red sub-pixel that are adjacent in the first pixel.

When the position of the preset sub-pixel in the second pixel is the same as the position of the second combined sub-pixel in the first pixel, the second pixel includes the red sub-pixel, the green sub-pixel, the blue sub-pixel, and the preset sub-pixel. In this case, the half blue sub-pixel and the half green sub-pixel that are adjacent in the 2PD sub-pixels on the basis of the first pixel may be used as the preset sub-pixel, that is, the position of the preset sub-pixel in the second pixel is the same as the positions of the half green sub-pixel and the half blue sub-pixel that are adjacent in the first pixel.

On the basis of the foregoing embodiment, the pixel unit includes one second pixel and at least one first pixel.

The pixel unit includes one second pixel and at least one first pixel, where a quantity of pixels in the pixel unit is at least two. When there are two pixels in the pixel unit, one first pixel and one second pixel are included. For example, as shown in FIG. 5a, the pixel unit includes one first pixel and one second pixel, where the second pixel includes a red sub-pixel, a green sub-pixel, and a preset sub-pixel, and a proportion of the preset sub-pixel to the pixel unit is ⅛.

Figures 5B, 6A, 6B, 7:
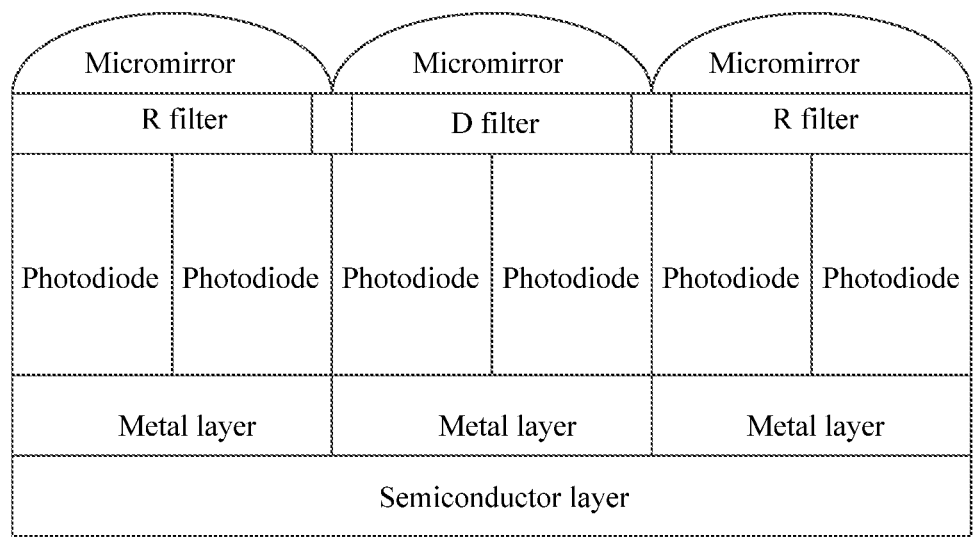
FIG. 5b is a schematic diagram 9 of a pixel unit according to an embodiment of this disclosure.
FIG. 6a is a schematic diagram 10 of a pixel unit according to an embodiment of this disclosure.
FIG. 6b is a schematic diagram 11 of a pixel unit according to an embodiment of this disclosure.
FIG. 7 is a cross-sectional view of a pixel according to an embodiment of this disclosure.

When there are three pixels in the pixel unit, two first pixels and one second pixel are included. For example, as shown in FIG. 5b, the pixel unit includes two first pixels and one second pixel, where the second pixel includes a blue sub-pixel, a green sub-pixel, and a preset sub-pixel, and a proportion of the preset sub-pixel to the pixel unit is 1/12.

When there are four pixels in the pixel unit, three first pixels and one second pixel are included. For example, as shown in FIG. 3a, the pixel unit includes three first pixels and one second pixel, and the second pixel includes a blue sub-pixel, a green sub-pixel, a red sub-pixel, and a preset sub-pixel. A half red sub-pixel and a half green sub-pixel of a 2PD sub-pixel on the basis of the first pixel may be used as the preset sub-pixel, and a proportion of the preset sub-pixel to the pixel unit is 1/16.

For the pixel array, ⅛-density RGB+D pixel units, 1/12-density RGB+D pixel units, or 1/16-density RGB+D pixel units may be used as a pixel unit array, and the pixel unit array is arranged periodically. Certainly, the pixel array may be in other forms, which are not described herein.

The foregoing several corresponding pixel sampling manners of the preset sub-pixel are merely used as examples for description, and may be other pixel sampling manners. The other pixel sampling manners in this embodiment of this disclosure are not described herein. A pixel sampling position of the preset sub-pixel in the pixel unit (the position of the second pixel) is not limited in this embodiment of this disclosure. A proportion of the preset sub-pixel to the pixel unit is ¼n, where n is an integer greater than or equal to 2, and a pixel array size applicable to the preset sub-pixel is not limited.

As shown in FIG. 4a and FIG. 4b, a position of a half preset sub-pixel in the second pixel is the same as a position of a half red sub-pixel, a half green sub-pixel, or a half blue sub-pixel in the first pixel, and half preset sub-pixels in two adjacent second pixels forms the preset sub-pixel.

The second pixel may contain only a half preset sub-pixel, and a complete preset sub-pixel may be obtained by combining two adjacent second pixels. When the second pixel includes a half preset sub-pixel, a position of the half preset sub-pixel in the second pixel may be the same as the position of the half red sub-pixel in the first pixel, or may be the same as the position of the half green sub-pixel in the first pixel, or may be the same as the position of the half blue sub-pixel in the first pixel.

When the position of the half preset sub-pixel in the second pixel is the same as the position of the half red sub-pixel in the first pixel, a position of a half preset sub-pixel in the other second pixel is the same as the position of the half green sub-pixel in the first pixel. When the position of the half preset sub-pixel in the second pixel is the same as the position of the half green sub-pixel in the first pixel, the position of the half preset sub-pixel in the other second pixel is the same as the position of the half blue sub-pixel or the half red sub-pixel in the first pixel.

On the basis of the foregoing embodiment, in the pixel unit, the quantity of the second pixels is two, and the quantity of the first pixels is greater than or equal to zero.

There are at least two pixels in the pixel unit, so that the pixel unit includes two second pixels and first pixels whose quantity is greater than or equal to zero. When there are two pixels in the pixel unit, two second pixels are included. For example, as shown in FIG. 6a, the pixel unit includes two second pixels. One second pixel includes one red sub-pixel, two green sub-pixels, a half blue sub-pixel, and a half preset sub-pixel. In this case, a position of the half preset sub-pixel in the second pixel is the same as a position of the half blue sub-pixel in the first pixel. The other second pixel includes one red sub-pixel, one green sub-pixel, one blue sub-pixel, a half green sub-pixel, and a half preset sub-pixel, and the position of the half preset sub-pixel is the same as the position of the half green sub-pixel in the first pixel. A proportion of the preset sub-pixel to the pixel unit is ⅛.

When there are three pixels in the pixel unit, two second pixels and one first pixel are included. As shown in FIG. 6b, when the pixel unit includes two second pixels and one first pixel, one second pixel includes one red sub-pixel, one green sub-pixel, one blue sub-pixel, a half green sub-pixel, and a half preset sub-pixel. In this case, a position of the half preset sub-pixel in the second pixel may be the same as a position of the half green sub-pixel in the first pixel, and the other second pixel includes two green sub-pixels, one blue sub-pixel, a half red sub-pixel, and a half preset sub-pixel. In this case, a position of the half preset sub-pixel is the same as a position of the half red sub-pixel in the first pixel. A proportion of the preset sub-pixel to the pixel unit is $1/12$.

When there are four pixels in the pixel unit, two second pixels and two first pixels are included. For example, as shown in FIG. 4b, when the pixel unit includes two second pixels and two first pixels, one second pixel includes one red sub-pixel, one green sub-pixel, one blue sub-pixel, a half green sub-pixel, and a half preset sub-pixel. In this case, a position of the half preset sub-pixel in the second pixel may be the same as a position of the half green sub-pixel in the first pixel, and the other second pixel includes one blue sub-pixel, two green sub-pixels, a half red sub-pixel, and a half preset sub-pixel. In this case, a position of the half preset sub-pixel is the same as a position of the half red sub-pixel in the first pixel. A proportion of the preset sub-pixel to the pixel unit is $1/16$.

These are only several corresponding implementations, and transformation may also be performed on this basis. Details are not described herein. A pixel sampling density of the preset sub-pixel in the pixel unit is $1/4n$, where n is an integer greater than or equal to 2, and a pixel array size applicable to the preset sub-pixel is not limited.

In this embodiment of this disclosure, the preset sub-pixel is used to receive a blue band and an infrared band. The preset sub-pixel includes a semiconductor layer, a metal layer, a photodiode, a first color filter, and a micromirror that are stacked in order, and the first color filter includes a blue filter and an infrared filter.

The semiconductor layer, the metal layer, the photodiode, the first color filter, and the micromirror that are included in the preset sub-pixel are arranged in order from bottom to top, where the semiconductor layer may be a silicon substrate, but is not limited thereto. The first color filter is an array of filter units, including a blue filter and an infrared filter. In this case, the preset sub-pixel may receive the blue band and the infrared band.

In this embodiment of this disclosure, the preset sub-pixel is used to receive a green band and an infrared band. The preset sub-pixel includes a semiconductor layer, a metal layer, a photodiode, a second color filter, and a micromirror that are stacked in order, and the second color filter includes a green filter and an infrared filter.

The second color filter is an array of filter units, including a green filter and an infrared filter. In this case, the preset sub-pixel may receive the green band and the infrared band.

In this embodiment of this disclosure, the preset sub-pixel is used to receive a red band and an infrared band. The preset sub-pixel includes a semiconductor layer, a metal layer, a photodiode, a third color filter, and a micromirror that are stacked in order, and the third color filter includes a red filter and an infrared filter.

The third color filter is an array of filter units, including a red filter and an infrared filter. In this case, the preset sub-pixel may receive the red band and the infrared band.

In this embodiment of this disclosure, the preset sub-pixel is used to receive a red band, a green band, a blue band, and an infrared band. The preset sub-pixel includes a semiconductor layer, a metal layer, a photodiode, a fourth color filter, and a micromirror that are stacked in order, and the fourth color filter includes a red filter, a green filter, a blue filter, and an infrared filter.

The fourth color filter is an array of filter units, including a red filter, a green filter, a blue filter, and an infrared filter. In this case, the preset sub-pixel may receive a red band, a green band, a blue band, and an infrared band.

In the same light condition, a wider bandwidth passing through a single channel indicates more brightness to be obtained by the image sensor, thereby improving a dark-state imaging effect.

In this embodiment of this disclosure, the red sub-pixel includes a semiconductor layer, a metal layer, a photodiode, a red filter, and a micromirror that are stacked in order; the green sub-pixel includes a semiconductor layer, a metal layer, a photodiode, a green filter, and a micromirror that are stacked in order; and the blue sub-pixel includes a semiconductor layer, a metal layer, a photodiode, a blue filter, and a micromirror that are stacked in order.

The semiconductor layer, the metal layer, the photodiode, the red filter, and the micromirror that are included in the red sub-pixel are arranged in order from bottom to top. The semiconductor layer, the metal layer, the photodiode, the green filter, and the micromirror that are included in the corresponding green sub-pixel are arranged in order from bottom to top. The semiconductor layer, the metal layer, the photodiode, the blue filter, and the micromirror that are included in the blue sub-pixel are arranged in order from bottom to top. The semiconductor layer herein may be a silicon substrate, but is not limited thereto. For structures of the red sub-pixel and the preset sub-pixel, refer to FIG. 7. A D filter in FIG. 7 may be the first, second, third, or fourth color filter. A green or blue sub-pixel structure may be obtained by replacing the red filter with the green or blue filter.

The red, green, and blue sub-pixels are used to obtain color information of pixels of a composite image, and block incidence of infrared rays. For example, only visible light with a wavelength of 380 nm to 700 nm is allowed to pass, so as to directly generate a vivid full-color image under high illumination. The infrared wavelength is 750 nm to 1100 nm, and the infrared band may be received by the preset sub-pixel, thereby improving the dark-state imaging effect and implementing an infrared distance detection function.

In this embodiment of this disclosure, the image sensor is a complementary metal oxide semiconductor CMOS image sensor, a charge-coupled device CCD image sensor, or a quantum thin-film image sensor.

A type of the image sensor to which the pixel array arrangement mode in this disclosure is applicable is not limited. The image sensor may be a CMOS image sensor, a charge-coupled device (CCD) image sensor, a quantum thin-film image sensor, or other types of image sensors. The image sensor in this embodiment of this disclosure can be applied to any electronic products including a camera module.

In this way, an RGB pixel array arrangement of a 2PD image sensor is improved by optimizing the RGB pixel array arrangement to a pixel array arrangement in which RGB pixels and a preset pixel are combined. In this way, distance detection can be implemented in a 2PD manner to ensure fast focus. The preset pixels used for receiving different light bands are set to increase an amount of incident light, thereby improving the photoelectric conversion efficiency, ensuring the dark-state photographing effect, and meeting use requirements of users.

Figure 8:
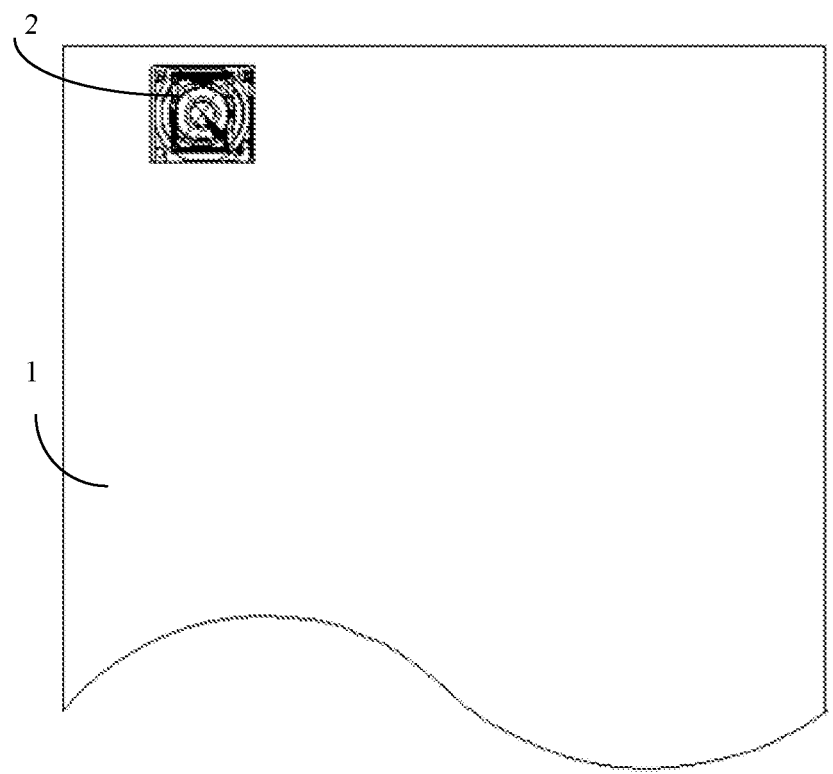
FIG. 8 is a schematic diagram of a mobile terminal according to an embodiment of this disclosure.
Figure 9:
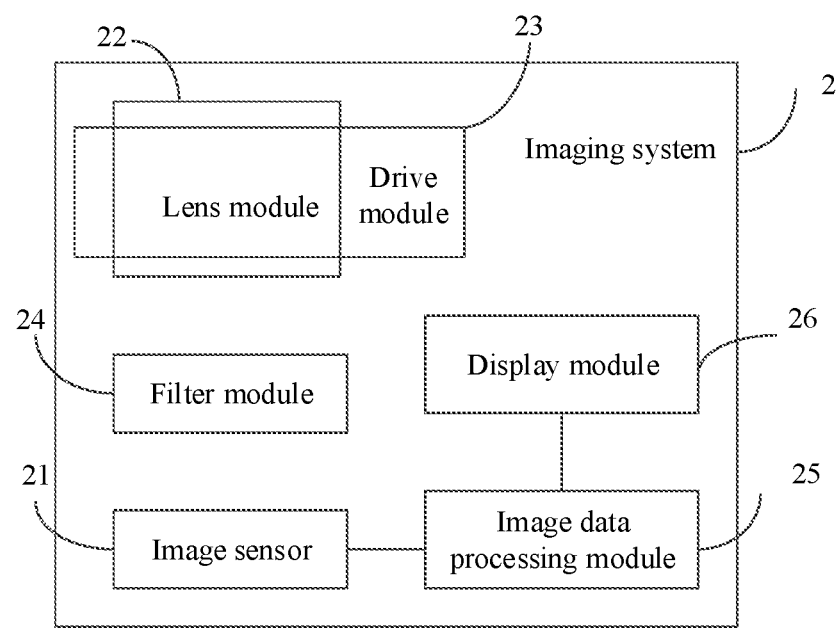
FIG. 9 is a schematic diagram of an imaging system according to an embodiment of this disclosure.

An embodiment of this disclosure further provides a mobile terminal. As shown in FIG. 8 and FIG. 9, the mobile terminal 1 includes an imaging system 2, and the imaging system 2 includes the foregoing image sensor 21. The mobile terminal 1 further includes a lens module 22, a drive module 23 configured to drive movement of the lens module 22; a filter module 24 disposed between the lens module 22 and the image sensor 21; an image data processing module 25 connected to the image sensor 21; and a display module 26 connected to the image data processing module 25.

The mobile terminal 1 in this embodiment of this disclosure includes an imaging system 2, where the imaging system 2 includes the foregoing image sensor 21, and the imaging system 2 further includes a lens module 22 for focusing light. The lens module 22 is connected to the drive module 23, and the drive module 23 is configured to adjust a position of the lens module 22 based on a distance of an object to be photographed.

The filter module 24 is disposed between the lens module 22 and the image sensor 21, and light can be focused on the pixel array of the image sensor 21 after being focused through the lens module 22 and passing through the filter module 24. The image sensor 21 is connected to the image data processing module 25, and the image data processing module 25 is connected to the display module 26. After the light is focused on the pixel array of the image sensor 21, the image sensor 21 performs photoelectric conversion and transmits data to the image data processing module 25. The image data processing module 25 processes the data and presents the data in a picture form on the display module 26.

After the drive module 23 adjusts the position of the lens module 22, a phase difference can be obtained by using the 2PD pixels in the image sensor 21, so that a distance between the object and an imaging surface can be obtained, thereby implementing fast focus.

An optical wavelength of 380 nm to 1100 nm may pass through the filter module 24 in this embodiment of this disclosure. In this case, after being focused by the lens module 22, the light may be filtered by the filter module 24. The filter module 24 allows natural light and infrared rays to pass through, and can be used to ensure the imaging effect of the imaging system 2.

In this way, an RGB pixel array arrangement of a 2PD image sensor is improved by optimizing the RGB pixel array arrangement to a pixel array arrangement in which RGB pixels and a preset pixel are combined. In this way, distance detection can be implemented in a 2PD manner to ensure fast focus. The preset pixels used for receiving different light bands are set to increase an amount of incident light, thereby improving the photoelectric conversion efficiency, ensuring the dark-state photographing effect, and meeting use requirements of users.

Figure 10:
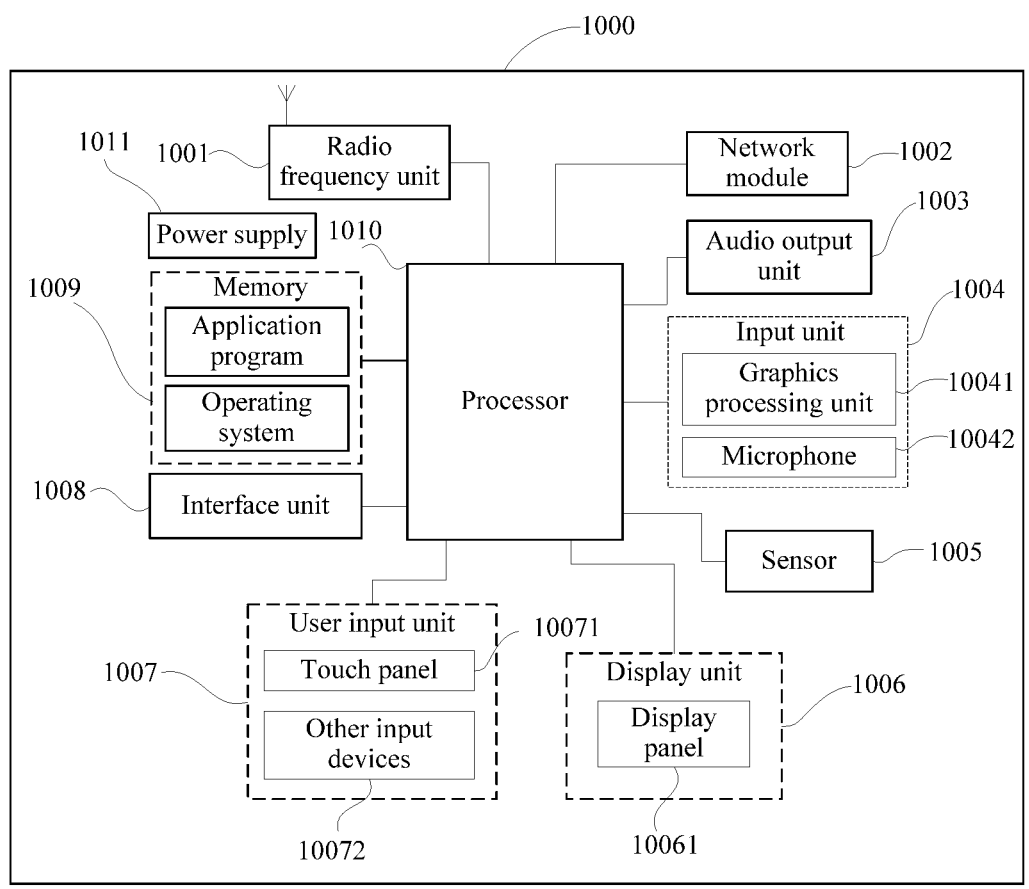
FIG. 10 is a schematic diagram of a hardware structure of a mobile terminal according to an embodiment of this disclosure.

FIG. 10 is a schematic diagram of a hardware structure of a mobile terminal according to the embodiments of this disclosure. The mobile terminal 1000 includes but is not limited to components such as a radio frequency unit 1001, a network module 1002, an audio output unit 1003, an input unit 1004, a sensor 1005, a display unit 1006, a user input unit 1007, an interface unit 1008, a memory 1009, a processor 1010, and a power supply 1011.

The mobile terminal 1000 further includes an imaging system. The imaging system includes an image sensor, a lens module, a drive module configured to drive movement of the lens module; a filter module disposed between the lens module and the image sensor; an image data processing module connected to the image sensor; and a display module connected to the image data processing module.

The filter module may allow light with a wavelength of 380 nm to 1100 nm to pass.

The image sensor includes a pixel array. The pixel array includes a preset quantity of pixel units arranged in a predetermined manner, and the pixel unit includes a first pixel and a second pixel adjacent to the first pixel. The first pixel includes a red sub-pixel, a green sub-pixel, and a blue sub-pixel. The second pixel includes a green sub-pixel, a preset sub-pixel, and at least one of a red sub-pixel or a blue sub-pixel.

Both the first pixel and the second pixel are full-pixel dual-core focusing pixels, and each of the first pixel and the second pixel includes four full-pixel dual-core focusing sub-pixels.

The preset sub-pixel receives an infrared band and one of a red band, a green band, and a blue band, or the preset sub-pixel receives an infrared band, a red band, a green band, and a blue band.

A position of the preset sub-pixel in the second pixel is the same as a position of the red sub-pixel, the green sub-pixel, or the blue sub-pixel in the first pixel.

Alternatively, the position of the preset sub-pixel in the second pixel is the same as a position of a first combined sub-pixel in the first pixel or the same as a position of a second combined sub-pixel in the first pixel.

The first combined sub-pixel is a combination of half the red sub-pixel and half the green sub-pixel that are adjacent; and the second combined sub-pixel is a combination of half the green sub-pixel and half the blue sub-pixel that are adjacent.

The pixel unit includes one second pixel and at least one first pixel.

A position of a half preset sub-pixel in the second pixel is the same as a position of a half red sub-pixel, a half green sub-pixel, or a half blue sub-pixel in the first pixel, and half preset sub-pixels of two adjacent second pixels form the preset sub-pixel.

In the pixel unit, a quantity of the second pixels is two, and a quantity of the first pixels is greater than or equal to zero.

The preset sub-pixels are used to receive a blue band and an infrared band.

The preset sub-pixel includes a semiconductor layer, a metal layer, a photodiode, a first color filter, and a micromirror that are stacked in order, where the first color filter includes a blue filter and an infrared filter.

The preset sub-pixels are used to receive a green band and an infrared band.

The preset sub-pixel includes a semiconductor layer, a metal layer, a photodiode, a second color filter, and a micromirror that are stacked in order, where the second color filter includes a green filter and an infrared filter.

The preset sub-pixels are used to receive a red band and an infrared band.

The preset sub-pixel includes a semiconductor layer, a metal layer, a photodiode, a third color filter, and a micromirror that are stacked in order, where the third color filter includes a red filter and an infrared filter.

The preset sub-pixels are used to receive a red band, a green band, a blue band, and an infrared band.

The preset sub-pixel includes a semiconductor layer, a metal layer, a photodiode, a fourth color filter, and a micromirror that are stacked in order, where the fourth color filter includes a red filter, a green filter, a blue filter, and an infrared filter.

The red sub-pixel includes a semiconductor layer, a metal layer, a photodiode, a red filter, and a micromirror that are stacked in order; the green sub-pixel includes a semiconductor layer, a metal layer, a photodiode, a green filter, and a micromirror that are stacked in order; and the blue sub-pixel includes a semiconductor layer, a metal layer, a photodiode, a blue filter, and a micromirror that are stacked in order.

The image sensor is a complementary metal oxide semiconductor CMOS image sensor, a charge-coupled device CCD image sensor, or a quantum thin-film image sensor.

In the mobile terminal, an RGB pixel array arrangement of a 2PD image sensor is improved by optimizing the RGB pixel array arrangement to a pixel array arrangement in which RGB pixels and a preset pixel are combined. In this way, distance detection can be implemented in a 2PD manner to ensure fast focus. The preset pixels used for receiving different light bands are set to increase an amount of incident light, thereby improving the photoelectric conversion efficiency, ensuring a dark-state photographing effect, and meeting use requirements of users.

A person skilled in the art can understand that the structure of the mobile terminal shown in FIG. 10 does not constitute any limitation on the mobile terminal, and the mobile terminal may include more or fewer components than those shown in the figure, or a combination of some components, or the components disposed differently. In this embodiment of this disclosure, the mobile terminal includes but is not limited to a mobile phone, a tablet computer, a laptop computer, a palmtop computer, an in-vehicle terminal, a wearable device, a pedometer, and the like.

It should be understood that in this embodiment of this disclosure, the radio frequency unit 1001 may be configured to receive and send information, or to receive and send a signal in a call process, and specially, after receiving downlink data from a base station, send the downlink data to the processor 1010 for processing; and also send uplink data to the base station. Generally, the radio frequency unit 1001 includes but is not limited to an antenna, at least one amplifier, a transceiver, a coupler, a low noise amplifier, a duplexer, and the like. In addition, the radio frequency unit 1001 may also communicate with a network and other devices via a wireless communications system.

The mobile terminal provides the user with wireless broadband Internet access through the network module 1002, for example, helping the user to send and receive e-mails, browse web pages, and access streaming media.

The audio output unit 1003 may convert audio data received by the radio frequency unit 1001 or the network module 1002 or stored in the memory 1009 into an audio signal and output the audio signal as a sound. Furthermore, the audio output unit 1003 may further provide audio output (for example, a call signal received sound or a message received sound) related to a specific function performed by the mobile terminal 1000. The audio output unit 1003 includes a speaker, a buzzer, a receiver, and the like.

The input unit 1004 is configured to receive an audio or video signal. The input unit 1004 may include a graphics processing unit (GPU) 10041 and a microphone 10042. The graphics processing unit 10041 processes image data of a still picture or video obtained by an image capture apparatus (such as a camera) in a video capture mode or an image capture mode. A processed image frame may be displayed on the display unit 1006. The display unit herein is the foregoing display module. The image frame processed by the graphics processing unit 10041 may be stored in the memory 1009 (or another storage medium) or be sent by the radio frequency unit 1001 or the network module 1002. The graphics processing unit 10041 is the foregoing image data processing module. The microphone 10042 is capable of receiving sounds and processing such sounds into audio data. The processed audio data can be converted into a format output that can be sent to a mobile communication base station through the radio frequency unit 1001 in a telephone call mode.

The mobile terminal 1000 may further include at least one sensor 1005, for example, an optical sensor, a motion sensor, and another sensor. Specifically, the optical sensor may include an ambient light sensor and a proximity sensor. The ambient light sensor may adjust luminance of the display panel 10061 according to brightness of ambient light, and the proximity sensor may turn off the display panel 10061 and/or backlight when the mobile terminal 1000 moves close to an ear. As a type of motion sensor, an accelerometer sensor can detect magnitudes of accelerations in all directions (usually three axes), can detect a magnitude and a direction of gravity when the mobile phone is in a static state, and can be applied to mobile terminal posture recognition (such as screen switching between portrait and landscape, related games, and magnetometer posture calibration), functions related to vibration recognition (such as pedometer and tapping), and the like. The sensor 1005 may further include a fingerprint sensor, a pressure sensor, an iris sensor, a molecular sensor, a gyroscope, a barometer, a hygrometer, a thermometer, an infrared sensor, and the like. Details are not described herein.

The display unit 1006 is configured to display information input by the user or information provided to the user. The display unit 1006 may include a display panel 10061, and the display panel 10061 may be configured in a form of a liquid crystal display (LCD), an organic light-emitting diode (OLED), or the like.

The user input unit 1007 may be configured to receive input digit or character information and generate key signal input related to user setting and function control of the mobile terminal. Specifically, the user input unit 1007 may include a touch panel 10071 and other input devices 10072. The touch panel 10071, also referred to as a touchscreen, can collect a touch operation (such as an operation performed by the user on the touch panel 10071 or near the touch panel 10071 with a finger or by using any proper object or accessory such as a stylus) of the user on or near the touch panel 10071. The touch panel 10071 may include two parts: a touch detection apparatus and a touch controller. The touch detection apparatus detects a touch azimuth of a user, detects a signal brought by a touch operation, and transmits the signal to the touch controller. The touch controller receives touch information from the touch detection apparatus, converts the touch information into touchpoint coordinates, and sends the touchpoint coordinates to the processor 1010, and can receive a command sent by the processor 1010 and execute the command. In addition, the touch panel 10071 may be implemented in a plurality of types, such as a resistive type, a capacitive type, an infrared type, and a surface acoustic wave type. In addition to the touch panel 10071, the user input unit 1007 may further include other input devices 10072. Specifically, the other input devices 10072 may include but are not limited to a physical keyboard, a function key (such as a volume control key or a power on/off key), a trackball, a mouse, a joystick, and the like. Details are not described herein.

Further, the touch panel 10071 may cover the display panel 10061. When detecting a touch operation on or near the touch panel 10071, the touch panel 10071 transmits the touch operation to the processor 1010 to determine a type of a touch event. Then, the processor 1010 provides a corresponding visual output on the display panel 10061 based on the type of the touch event. Although in FIG. 10, the touch panel 10071 and the display panel 10061 act as two independent parts to implement input and output functions of the mobile terminal, in some embodiments, the touch panel 10071 and the display panel 10061 may be integrated to implement the input and output functions of the mobile terminal. This is not specifically limited herein.

The interface unit 1008 is an interface between an external apparatus and the mobile terminal 1000. For example, an external apparatus may include a wired or wireless headset port, an external power supply (or a battery charger) port, a wired or wireless data port, a memory port, a port for connecting an apparatus with an identification module, an audio input/output (I/O) port, a video I/O port, an earphone port, and the like. The interface unit 1008 may be configured to receive an input (for example, data information or power) from an external apparatus and transmit the received input to one or more elements within the mobile terminal 1000, or may be configured to transmit data between the mobile terminal 1000 and the external apparatus.

The memory 1009 may be configured to store software programs and various data. The memory 1009 may primarily include a program storage area and a data storage area. The program storage area may store an operating system, an application (such as an audio play function and an image play function) required by at least one function, and the like. The data storage area may store data (such as audio data and a phone book) created based on use of the mobile phone. In addition, the memory 1009 may include a high-speed random access memory, and may further include a non-volatile memory such as a disk storage device, a flash memory device, or other volatile solid-state storage devices.

The processor 1010 is a control center of the mobile terminal, and is connected to all components of the mobile terminal by using various interfaces and lines. By running or executing a software program and/or module that is stored in the memory 1009 and calling data stored in the memory 1009, the processor 1010 executes various functions of the mobile terminal and processes data, so as to perform overall monitoring on the mobile terminal. The processor 1010 may include one or more processing units. Optionally, an application processor and a modem processor may be integrated in the processor 1010. The application processor primarily processes an operating system, user interfaces, application programs, and the like. The modem processor primarily processes radio communication. It can be understood that the modem processor may alternatively be not integrated in the processor 1010.

The mobile terminal 1000 may further include a power supply 1011 (such as a battery) that supplies power to components. Optionally, the power supply 1011 may be logically connected to the processor 1010 through a power management system. In this way, functions such as charge management, discharge management, and power consumption management are implemented by using the power management system.

In addition, the mobile terminal 1000 includes some functional modules that are not shown. Details are not described herein.

It should be noted that the terms "include", "comprise", or any of their variants in this specification are intended to cover a non-exclusive inclusion, such that a process, a method, an article, or an apparatus that includes a list of elements not only includes those elements but also includes other elements that are not expressly listed, or further includes elements inherent to such process, method, article, or apparatus. In absence of more restrictions, an element preceded by "includes a . . . " does not preclude the existence of other identical elements in the process, method, article, or apparatus that includes the element.

According to the foregoing description of the implementation manners, a person skilled in the art may clearly understand that the foregoing embodiments may be implemented by using software in combination with a necessary common hardware platform, and certainly may alternatively be implemented by using hardware. However, in most cases, the former is a preferred implementation manner. Based on such an understanding, the technical solutions of this disclosure essentially or the part contributing to the prior art may be implemented in a form of a software product. The software product is stored in a storage medium (such as a read-only memory (ROM)/random access memory (RAM), a magnetic disk, or an optical disc), and includes several instructions for instructing a terminal (which may be a mobile phone, a computer, a server, an air conditioner, a network device, or the like) to perform the methods described in the embodiments of this disclosure.

The foregoing describes the embodiments of this disclosure with reference to the accompanying drawings. However, this disclosure is not limited to the foregoing specific implementation manners. The foregoing specific implementation manners are merely illustrative rather than restrictive. As instructed by this disclosure, persons of ordinary skill in the art may develop many other manners without departing from principles of this disclosure and the protection scope of the claims, and all such manners fall within the protection scope of this disclosure.

What is claimed is:

1. An image sensor, comprising:
a pixel array, wherein the pixel array comprises a preset quantity of pixel units arranged in a predetermined manner, and the pixel unit comprises a first pixel and a second pixel adjacent to the first pixel; the first pixel comprises a red sub-pixel, a green sub-pixel, and a blue sub-pixel, and the second pixel comprises a green sub-pixel, a preset sub-pixel, and at least one of a red sub-pixel and a blue sub-pixel;
both the first pixel and the second pixel are full-pixel dual-core focusing pixels, and each of the first pixel and the second pixel comprises four full-pixel dual-core focusing sub-pixels; and
the preset sub-pixel receives an infrared band and one of a red band, a green band, and a blue band, or the preset sub-pixel receives an infrared band, a red band, a green band, and a blue band;
wherein a position of a half preset sub-pixel in the second pixel is the same as a position of a half red sub-pixel, a half green sub-pixel, or a half blue sub-pixel in the first pixel, and half preset sub-pixels of two adjacent second pixels form the preset sub-pixel.

2. The image sensor according to claim 1, wherein
a position of the preset sub-pixel in the second pixel is the same as a position of the red sub-pixel, the green sub-pixel, or the blue sub-pixel in the first pixel; or
a position of the preset sub-pixel in the second pixel is the same as a position of a first combined sub-pixel in the first pixel or the same as a position of a second combined sub-pixel in the first pixel; wherein
the first combined sub-pixel is a combination of half the red sub-pixel and half the green sub-pixel that are adjacent; and the second combined sub-pixel is a combination of half the green sub-pixel and half the blue sub-pixel that are adjacent.

3. The image sensor according to claim 2, wherein the pixel unit comprises one second pixel and at least one first pixel.

4. The image sensor according to claim 1, wherein in the pixel unit, a quantity of the second pixels is two, and a quantity of the first pixels is greater than or equal to zero.

5. The image sensor according to claim 1, wherein the preset sub-pixel is used to receive a blue hand and an infrared band; and
the preset sub-pixel comprises a semiconductor layer, a metal layer, a photodiode, a first color filter, and a micromirror that are stacked in order, wherein the first color filter comprises a blue filter and an infrared filter.

6. The image sensor according to claim 1, wherein the preset sub-pixel is used to receive a green hand and an infrared band; and
the preset sub-pixel comprises a semiconductor layer, a metal layer, a photodiode, a second color filter, and a micromirror that are stacked in order, wherein the second color filter comprises a green filter and an infrared filter.

7. The image sensor according to claim 1, wherein the preset sub-pixel is used to receive a red band and an infrared band; and
the preset sub-pixel comprises a semiconductor layer, a metal layer, a photodiode, a third color filter, and a micromirror that are stacked in order, wherein the third color filter comprises a red filter and an infrared filter.

8. The image sensor according to claim 1, wherein the preset sub-pixel is used to receive a red band, a green band, a blue hand, and an infrared band; and
the preset sub-pixel comprises a semiconductor layer, a metal layer, a photodiode, a fourth color filter, and a micromirror that are stacked in order, wherein the fourth color filter comprises a red filter, a green filter, a blue filter, and an infrared filter.

9. The image sensor according to claim 1, wherein the red sub-pixel comprises a semiconductor layer, a metal layer, a photodiode, a red filter, and a micromirror that are stacked in order;
the green sub-pixel comprises a semiconductor layer, a metal layer, a photodiode, a green filter, and a micromirror that are stacked in order; and
the blue sub-pixel comprises a semiconductor layer, a metal layer, a photodiode, a blue filter, and a micromirror that are stacked in order.

10. The image sensor according to claim 1, wherein the image sensor is a complementary metal oxide semiconductor (CMOS) image sensor, a charge-coupled device (CCD) image sensor, or a quantum thin-film image sensor.

11. A mobile terminal, comprising an imaging system, wherein the imaging system comprises:
the image sensor according to claim 1;
a lens module;
a drive module configured to drive movement of the lens module;
a filter module disposed between the lens module and the image sensor;
an image data processing module connected to the image sensor; and
a display module connected to the image data processing module.

12. The mobile terminal according to claim 11, wherein the filter module is capable of allowing light with a wavelength of 380 nm to 1100 nm to pass.

13. The mobile terminal according to claim 11, wherein
a position of the preset sub-pixel in the second pixel is the same as a position of the red sub-pixel, the green sub-pixel, or the blue sub-pixel in the first pixel; or
a position of the preset sub-pixel in the second pixel is the same as a position of a first combined sub-pixel in the first pixel or the same as a position of a second combined sub-pixel in the first pixel; wherein
the first combined sub-pixel is a combination of half the red sub-pixel and half the green sub-pixel that are adjacent; and the second combined sub-pixel is a combination of half the green sub-pixel and half the blue sub-pixel that are adjacent.

14. The mobile terminal according to claim 13, wherein the pixel unit comprises one second pixel and at least one first pixel.

15. The mobile terminal according to claim 11, wherein in the pixel unit, a quantity of the second pixels is two, and a quantity of the first pixels is greater than or equal to zero.

16. The mobile terminal according to claim 11, wherein the preset sub-pixel is used to receive a blue band and an infrared band; and
the preset sub-pixel comprises a semiconductor layer, a metal layer, a photodiode, a first color filter, and a micromirror that are stacked in order, wherein the first color filter comprises a blue filter and an infrared filter.

17. The mobile terminal according to claim 11, wherein the preset sub-pixel is used to receive a green band and an infrared band; and
the preset sub-pixel comprises a semiconductor layer, a metal layer, a photodiode, second color filter, and a micromirror that are stacked in order, wherein the second color filter comprises a green filter and an infrared filter.

18. The mobile terminal according to claim 11, wherein the preset sub-pixel is used to receive a red band and an infrared band; and
the preset sub-pixel comprises a semiconductor layer, a metal layer, a photodiode, a third color filter, and a micromirror that are stacked in order, wherein the third color filter comprises a red filter and an infrared filter.

* * * * *